United States Patent [19]

Yamazaki

[11] Patent Number: 4,730,207
[45] Date of Patent: Mar. 8, 1988

[54] NON-SINGLE-CRYSTAL SEMICONDUCTOR LIGHT EMITTING DEVICE

[75] Inventor: Shunpei Yamazaki, Tokyo, Japan

[73] Assignee: Semiconductor Energy Laboratory Co., Ltd., Kanagawa, Japan

[21] Appl. No.: 842,950

[22] Filed: Mar. 24, 1986

Related U.S. Application Data

[62] Division of Ser. No. 645,773, Aug. 30, 1984.

[30] Foreign Application Priority Data

Aug. 30, 1983 [JP] Japan ................................ 58-160026

[51] Int. Cl.$^4$ .............................................. H01L 27/12
[52] U.S. Cl. .......................................... 357/4; 357/16; 357/17; 357/2
[58] Field of Search ....................... 357/2, 4, 4 SL, 17, 357/16

[56] References Cited

U.S. PATENT DOCUMENTS 4,559,552 12/1985 Yamazaki ........................... 357/2 X

OTHER PUBLICATIONS

Abeles et al., *Phys. Rev. Lett.*, vol. 51, No. 21, Nov. 21, 1983.

*Primary Examiner*—Martin H. Edlow
*Attorney, Agent, or Firm*—Gerald J. Ferguson, Jr.; Michael P. Hoffman; Michael J. Foycik, Jr.

[57] ABSTRACT

A non-single crystal semiconductor light emitting device comprising a non-single crystal semiconductor region formed by a non-single crystal semiconductor laminate member made up of a plurality m (where $m \geq 3$) of non-single-crystal semiconductor layers $M_1$, $M_2$, ... and $M_m$ sequentially laminate in this order. The thickness of each $M_1$, $M_2$ ... $M_m$ is 100 Å or less.

2 Claims, 6 Drawing Figures

NON-SINGLE-CRYSTAL SEMICONDUCTOR LIGHT EMITTING DEVICE

This is a divisional application of Ser. No. 645,773, filed Aug. 30, 1984.

BACKGROUND OF THE INVENTION

1. Field of the Invention

The present invention relates to a non-single-crystal semiconductor light emitting device which is produced through using a non-single-crystal semiconductor.

2. Description of the Prior Art

Conventionally known as a non-single-crystal semiconductor light emitting device is one that comprises a first electrode, a first non-single-crystal semiconductor layer of a first conductivity type, which is formed on the first electrode and makes ohmic contact therewith, an I-type non-single crystal semiconductor region formed on the first non-single-crystal semiconductor layer, a second non-single-crystal semiconductor layer of a second conductivity type reverse from the first conductivity type, which is formed on the I-type non-single-crystal semiconductor region, and a second electrode which is formed on the second non-single-crystal semiconductor layer and makes ohmic contact therewith. In this case, the non-single-crystal region is formed by a single non-single-crystal semiconductor layer.

With the light emitting device of such a construction, when connecting a DC bias source of a predetermined polarity between the first and second electrode, electrons (or holes) are injected into the non-single-crystal semiconductor region from the first electrode towards the second electrode, and holes (or electrons) are injected into the non-single-crystal semiconductor region from the second electrode towards the first electrode layer. The electrons (or holes) injected into the non-single-crystal semiconductor region from the first electrode flow towards the second electrode without being accumulated at the bottom of the conduction band (or valence band) of the single non-single-crystal semiconductor layer forming the non-single-crystal semiconductor region. Similarly, the holes (or electrons) injected into the non-single-crystal semiconductor region from the second electrode flow towards the first electrode layer without being accumulated at the bottom of the valence band (or conduction band) of the single non-single-crystal semiconductor layer forming the non-single-crystal semiconductor region. The electrons (or holes) thus flowing in the non-single-crystal semiconductor region from the first electrode towards the second one and the holes (or electrons) thus flowing from the second electrode towards the first one are recombined with each other in the non-single-crystal semiconductor region. As a result of this, light is obtained in the non-single-crystal semiconductor region, and this light is emitted as the output light from the non-single-crystal semiconductor light emitting device.

With the conventional non-single-crystal semiconductor light emitting device described above, those of the electrons (or holes) injected from the first electrode which do not recombine with the holes (or electrons) but reach the second electrode are nonnegligibly large in quantity, and those of the holes (or electrons) injected from the second electrode which do not recombine with the electrons (or holes) but reach the first electrode are also nonnegligibly large in amount. This stems from the construction of the device itself and imposes severe limitations on its light emitting efficiency.

Further, the prior art device has the defect that the light therefrom cannot be obtained as light close to white light even by a suitable selection of the energy band gap of the non-single-crystal semiconductor layer forming the non-single-crystal semiconductor region.

SUMMARY OF THE INVENTION

It is therefore an object of the present invention to provide a novel non-single-crystal semiconductor light emitting device which is free from the abovesaid defects of the prior art.

A non-single-crystal semiconductor light emitting device in accordance with a first embodiment of the present invention, the non-single-crystal semiconductor light emitting device is comprised of a first electrode, a first non-single-crystal semiconductor layer of a first conductivity type, which is formed on the first electrode and makes ohmic contact therewith, a non-single-crystal semiconductor region formed on the first non-single-crystal semiconductor layer, a second non-single-crystal semiconductor layer which is formed on the non-single-crystal semiconductor region and has a second conductivity type reverse from the first conductivity type, and a second electrode which is formed on the second non-single-crystal semiconductor layer and makes ohmic contact therewith, as is the case with the conventional non-single-crystal semiconductor light emitting device described above.

In this non-single-crystal semiconductor light emitting device, however, the non-single-crystal semiconductor region is formed by a non-single-crystal semiconductor laminate member which is made up of a plurality m (where $m \geq 3$) of third non-single-crystal semiconductor layers $M_1, M_2, \ldots$ and $M_m$ laminated in this order. The energy gaps $Eg_1, Eg_2, \ldots$ and $Eg_m$ of the third non-single-crystal semiconductor layers $M_1$, $M_2$, and $M_m$ bear such relationships as $Eg_1 > Eg_2 < Eg_3$, $Eg_3 > Eg_4 < Eg_5, \ldots$ and $Eg_{(m-2)} > Eg_{(m-1)} < Eg_m$.

A non-single-crystal semiconductor light emitting device in accordance with a second embodiment of the present invention comprises a first electrode, a first non-single-crystal semiconductor layer of a first conductivity type, which is formed on the first electrode and makes ohmic contact therewith, a non-single-crystal semiconductor region formed in layers on the first non-single-crystal semiconductor layer, and a second electrode which is formed on the non-single-crystal semiconductor region and makes rectifying contact therewith. The non-single-crystal semiconductor region is formed by a non-single-crystal semiconductor laminate member as in the abovementioned non-single-crystal semiconductor light emitting device.

A non-single-crystal semiconductor light emitting device in accordance with third embodiment of the present invention comprises a first electrode, a non-single-crystal semiconductor region which is formed in layers on the first electrode layer and makes rectifying contact therewith, a non-single-crystal semiconductor layer which is formed on the non-single-crystal semiconductor region and has a second conductivity type reverse from the first one, and a second electrode which is formed on the non-single-crystal semiconductor layer and makes ohmic contact therewith. The non-single-crystal semiconductor region is formed by a non-single-crystal semiconductor laminate member as in the non-single-crystal semiconductor devices mentioned above.

The non-single-crystal semiconductor light emitting device in accordance with a fourth embodiment of the present invention comprises a first electrode, a non-single-crystal semiconductor region which is formed in layers on the first electrode and makes rectifying contact therewith, and a second electrode which is formed on the non-single-crystal semiconductor region and makes rectifying contact therewith. The non-single-crystal semiconductor region is constituted by a non-single-crystal semiconductor laminate member similar to that used in the aforementioned non-single-crystal semiconductor light emitting devices according to the first to third embodiments of the present invention.

In any one of the non-single-crystal semiconductor light emitting devices according to the first to fourth embodiments of the present invention, when connecting a bias source across the first and second electrode in a predetermined polarity, electrons (or holes) are injected into the non-single-crystal semiconductor region from the first electrode towards the second electrode layer, and holes (or electrons) are injected into the non-single-crystal semiconductor region from the second electrode towards the first electrode, as in the case of the aforesaid conventional non-single-crystal semiconductor light emitting device.

In any of the non-single-crystal semiconductor light emitting devices of the present invention, however, the electrons (or holes) injected into the non-single-crystal semiconductor region are sequentially accumulated at the bottoms of conduction bands (or valence bands) of the non-single-crystal semiconductor layers $M_2$, $M_4$, ... and $M_{(m-1)}$ of the non-single-crystal semiconductor region, and the holes (or electrons) injected into the non-single-crystal semiconductor region are also sequentially accumulated at the bottoms of valence bands (or conduction bands) of the non-single-crystal semiconductor layers $M_2$, $M_4$, ... and $M_{(m-1)}$. The electrons and holes thus accumulated at the bottoms of the conduction band and the valence band of the non-single-crystal semiconductor layer $M_i$ (where i=2, 4, ... (m−1)) recombine with each other in the non-single-crystal semiconductor layer $M_i$, emitting light. Accordingly, in any of the non-single-crystal semiconductor light emitting devices of the present invention, the electrons and holes injected into the non-single-crystal semiconductor region are accumulated in the non-single-crystal semiconductor layers $M_2$, $M_4$, ... and $M_{(m-1)}$ of the non-single-crystal semiconductor region, and on the basis of the thus accumulated electrons and holes, light $L_2$, $L_4$, ... and $L_{(m-1)}$ are obtained therefrom, and their composite light L is emitted as the output light from the non-single-crystal semiconductor light emitting device.

According to the non-single-crystal semiconductor light emitting devices of the present invention, since they have such constructions as referred to above, the amount of electrons (or holes) which are injected from the first electrode into the non-single-crystal semiconductor region but do not recombine with the holes (or electrons) therein and reach the second electrode and the amount of holes (or electrons) injected from the second electrode into the non-single-crystal semiconductor region but do not recombine with the electrons (or holes) therein and reach the first electrode are far smaller than in the case of the aforementioned conventional non-single-crystal semiconductor light emitting device. Therefore, the devices of the present invention are higher in light emitting efficiency than the prior art device.

Moreover, it is possible to obtain light having spectrums distributed over a wide range of wavelength by making all of some of the energy gaps $Eg_2$, $Eg_4$, ... and $Eg_{(m-1)}$ different from one another. That is, for example, near white light can be produced.

Other object, features and advantages of the present invention will become more fully apparent from the following detailed description taken in conjunction with the accompanying drawings.

DESCRIPTION OF THE PREFERRED EMBODIMENTS

Figure 1:
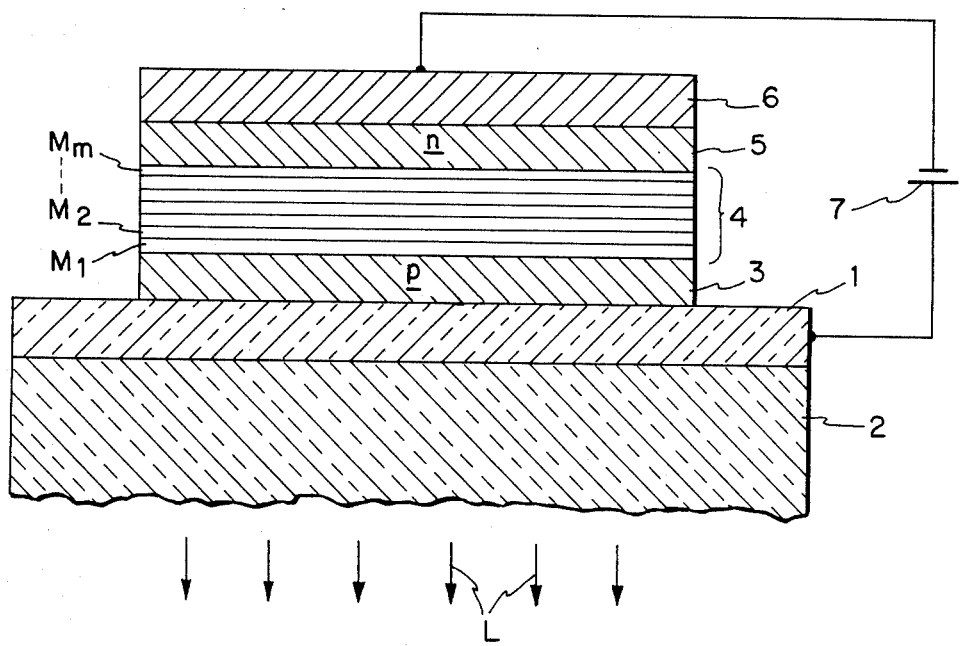
FIG. 1 is a sectional view schematically illustrating a first embodiment of the non-single-crystal semiconductor light emitting device of the present invention.

FIG. 1 illustrates a first embodiment of the non-single-crystal semiconductor light emitting device of the present invention, which has such a construction as follows:

That is, the non-single-crystal semiconductor light emitting device is provided with a first electrode 1.

The electrode 1 is formed in layer on a light-transparent insulating substrate 2 made of glass, ceramics, synthetic resin or the like.

The electrode 1 may be as of tin oxides, indium oxide, antimony oxide, indium-titanium oxide, a mixture of antimony oxide and titanium oxide or the like.

The electrode 1 is covered with a non-single-crystal semiconductor layer 3 which makes ohmic contact therewith.

The non-single-crystal semiconductor layer 3 is made of an amorphous, semi-amorphous or polycrystalline semiconductor. The semi-amorphous semiconductor has such a structure that its degree of crystallization varies spatially, and it is typically a semiconductor which is composed of a mixture of a micro-crystalline semiconductor having a lattice strain and a particle size of 5 to 200 A and a non-single-crystal semiconductor such as an amorphous semiconductor.

The semiconductor, which forms the non-single-crystal semiconductor layer 3 may be the Group IV element such as silicon Si or germanium Ge, a carbide of the Group IV element such as silicon carbide $Si_xC_{1-x}$ ($0<x<1$) or germanium carbide $Ge_xC_{1-x}$ ($0<x<1$), a nitride of the Group IV element such as silicon nitride $Si_3N_{4-x}$ ($0<x<4$) or germanium nitride $Ge_3N_{4-x}$ ($0<x<4$), an oxide of the Group IV element such as silicon oxide $SiO_{2-x}$ ($0<x<2$), or a Group IV elements compound such as $Ge_xSi_{1-x}$ ($0<x<1$).

The non-single-crystal semiconductor layer 3 is doped with the Group III element which is a p type impurity, such as boron B, aluminum Al, or indium In, to make the layer 3 p-type.

The non-single-crystal semiconductor layers 3 is doped with a dangling bond and recombination center neutralizer such as hydrogen or halogen such as fluorine.

The non-single-crystal semiconductor layer 3 is formed by a known CVD, plasma CVD, photo plasma CVD or photo CVD method, using the known material gas of the abovesaid semiconductor and the known material gas of the abovesaid P-type impurity. In this case, when the non-single-crystal semiconductor layer 3 is formed of, for example, silicon, silane ($Si_pH_{(2p+2)}$, where $p \geq 1$) or silicon difluoride ($SiF_2$) can be used as the semiconductor material gas. Further, diborane ($B_2H_6$) can be used as the P-type impurity. When the semiconductor material gas or the impurity material gas is not included with the aforesaid dangling bond and the recombination center neturalizer, they are used together with the semiconductor material gas and the impurity material gas.

The non-single-crystal semiconductor layer 3 is covered with a non-single-crystal semiconductor region 4 which is formed thereon in layers.

The non-single-crystal semiconductor layer 4 is formed by a non-single-crystal semiconductor laminate member which is made up of a plurality m (where $m \geq 3$) of non-single-crystal semiconductor layers $M_1$, $M_2$, ... and $M_m$ sequentially laminated in this order.

Figure 2:
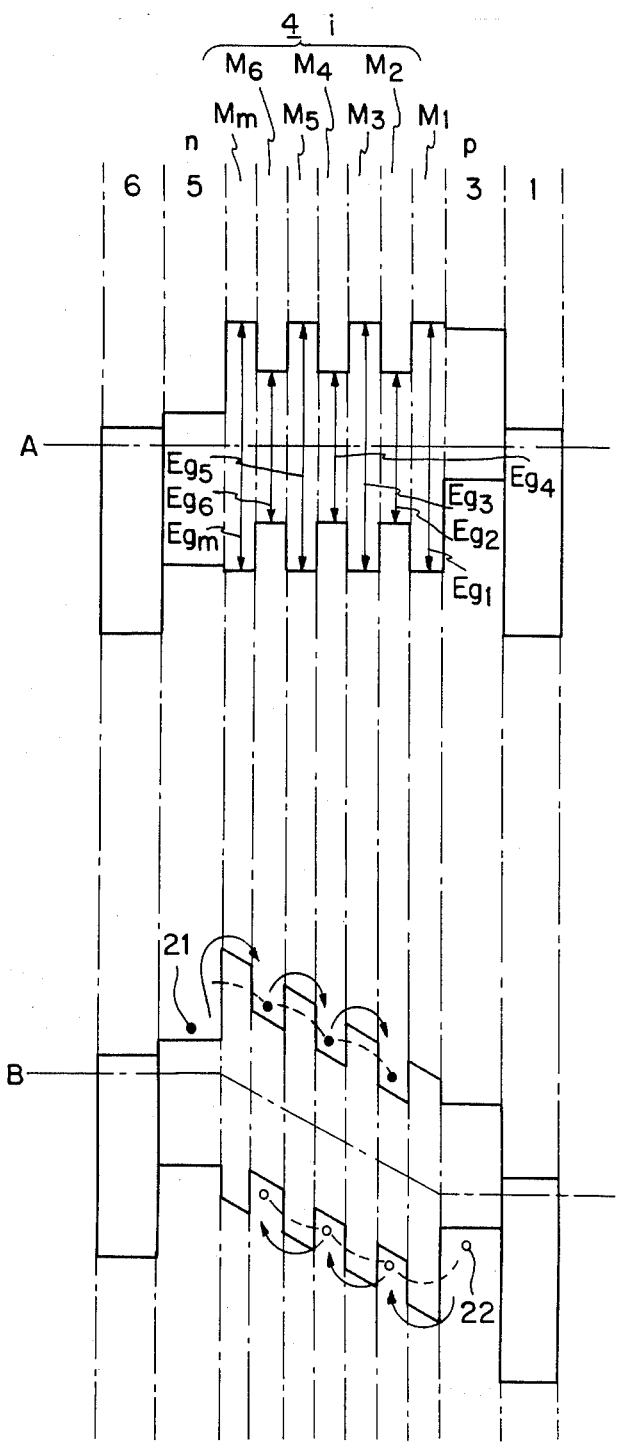
FIG. 2A is a diagram showing its energy band, explanatory of the device.
FIG. 2B is a diagram its energy band during operation, explanatory of the device.

Now, letting the energy gaps of the non-single-crystal semiconductor layers $M_1$, $M_2$, ... and $M_m$ be represented by $Eg_1$, $Eg_2$, ... and $Eg_m$, respectively, they bear such relationships as $Eg_1 > Eg_2 < Eg_3 > Eg_4 < Eg_5$, ... and $Eg_{(m-2)} > Eg_{(m-1)} > Eg_m$, shown in FIG. 2. Accordingly, the energy gap of an even-numbered non-single-crystal semiconductor layer $M_i (i=2, 4 ... (m-1))$ is smaller than those of two odd-numbered non-single-crystal semiconductor layers $M_{(i-1)}$ and $M_{(i+1)}$ adjoining thereto; namely, they bear such a relationship as $Eg_{(i-1)} > Eg_i < Eg_{(i+1)}$.

The non-single-crystal semiconductor layers $M_1$ to $M_m$ are formed of an amorphous, semi-amorphous or polycrystalline semiconductor, as is the case with the non-single-crystal semiconductor layer 3.

Of the non-single-crystal semiconductor layers $M_1$ to $M_m$, the even-numbered one $M_i$ can be made of the Group IV element, its carbide, nitride or oxide, or the Group IV element compound, as in the case of the non-single-crystal semiconductor layer 3.

The odd-numbered non-single-crystal semiconductor layers $M_{(i-1)}$ and $M_{(i+1)}$ can be made of the Group IV element, its carbide, nitride or oxide, or the Group IV element compound, as is the case with the even-numbered non-single-crystal semiconductor layer $M_i$. In this case, however, the semiconductor of the non-single-crystal semiconductor layers $M_{(i-1)}$ and $M_{(i+1)}$ must be selected from the aforesaid semiconductors so that the abovementioned relationships $Eg_{(i-1)} > Eg_i < Eg_{(i+1)}$ is obtained.

The non-single-crystal semiconductor layers $M_1$ to $M_m$ are not doped with any of the abovesaid Group III and IV elements or they are doped with them so that the conductivity type of the layers $M_1$ to $M_m$ may be compensated for, making the layers $M_1$ to $M_m$ exhibit the i conductivity type.

The non-single-crystal semiconductor layers $M_1$ to $M_m$ are doped with the aforementioned dangling bonds and the recombination center neutralizer, as is the case with the non-single-crystal semiconductor layer 3.

It is preferable that the non-single-crystal semiconductor layers $M_1$ to $M_m$ be smaller in thickness than the non-single-crystal semiconductor layer 3, for example, 100 A or less in thickness.

The non-single-crystal semiconductor layer $M_k$ (where $k = 1, 2, ... m$) can be formed by known various CVD methods using the known semiconductor material gas, if necessary, together with the dangling bond and the recombination center neutralizer, as in the case of the non-single-crystal semiconductor layer 3.

In the case where the even-numbered non-single-crystal semiconductor layer $M_i$ is formed of, for example, silicon, it is possible to use, as the semiconductor material gas, the aforementioned semiconductor material gases similar to those for the non-single-crystal semiconductor layer 3. When the odd-numbered non-single-crystal semiconductor layer $M_j$ (where $j = 1, 3, ... m$) is formed of, for instance, $Si_xN_{4-x}$ (where $0 < x < 4$), a gas mixture of the aforesaid silane gas and ammonia gas can be used as the semiconductor material gas. When the non-single-crystal semiconductor layer $M_j$ is formed of, for example, $SiO_{2-x}$ (where $0 < x < 2$), a gas mixture of the aforesaid silane gas and oxygen gas can be used as the semiconductor material gas. Further, when the non-single-crystal semiconductor layer is formed of, for example, $Si_xC_{1-x}$ (where $0 < x < 1$), a gas mixture of methane gas and the aforesaid silane gas, silicon carbide gas or methyl silane ($Si(CH_3)_nH_{4-n}$ (where $1 \leq n \leq 4$) can be employed.

The layered non-single-crystal semiconductor region 4 formed by the laminate member composed of the non-single-crystal semiconductor layers $M_1$ to $M_m$ is covered with a non-single-crystal semiconductor layer 5.

The non-single-crystal semiconductor layer 5 is formed of the amorphous, semi-amorphous or polycrystalline semiconductor, as in the cases of the non-single-crystal layer 3 and the non-single-crystal semiconductor region 4.

The non-single-crystal semiconductor layer 5 can be made of the aforementioned Group IV element, its carbide, nitride or oxide, or its compound semiconductor, as in the case of the non-single-crystal semiconductor layer 3.

The non-single-crystal semiconductor layer 5 is doped with the Group V element which is an n type impurity, such as phosphorus P, arsenic As, or antimony Sb, rendering the layer 5 n-type.

The non-single-crystal semiconductor layer 5 is doped with the aforesaid dangling bond and recombination center neutralizer, as is the case with the non-single-crystal semiconductor layer 3 and the non-single-crystal region 4.

The non-single-crystal semiconductor layer 5 can be formed by the known various CVD methods, using the aforementioned known semiconductor material gas and the aforesaid known N-type impurity material gas, together with the dangling bond and the recombination center neutralizer, as required, as in the case of the non-single-crystal semiconductor layer 3. In this case, phosphin ($PH_3$) gas can be used as the N-type impurity material gas.

The non-single-crystal semiconductor layer 5 is covered with an electrode 6 which is formed in layers on the non-single-crystal semiconductor layer 5 to make ohmic contact therewith.

The electrode 6 is non-light transparent and may be formed of, for instance, aluminum (Al), nickel (Ni), cobalt (Co) or molybdenum (Mo). Alternatively, the electrode 6 may also be formed to have such a structure that a reflecting layer made of aluminum, cobalt or molybdenum is laminated on a light-transparent electrode layer made of the material usable for the electrode 1, though not shown.

With the non-single-crystal semiconductor light emitting device of such a construction according to the present invention, it is possible to obtain such an operation as follows:

By connecting a DC bias source 7 across the electrodes 1 and 6 with the side of the electrode 1 made positive, the PIN structure constituted by the non-single-crystal semiconductor layer 3, the non-single-crystal semiconductor region 4 and the non-single-crystal semiconductor layer 5 is biased in the forward direction.

In consequence, electrons 21 are injected from the electrode 6 into the non-single-crystal semiconductor region 4 towards the electrode 1 across the ni junction defined between the non-single-crystal semiconductor layer 5 and the non-single-crystal semiconductor region 4. Further, holes 22 are injected from the electrode 1 into the non-single-crystal semiconductor region 4 towards the electrode 6 across the pi junction defined between the non-single-crystal semiconductor layer 3 and the non-single-crystal semiconductor region 4.

The electrons 21 thus injected into the non-single-crystal semiconductor layer region 4 are sequentially accumulated at the bottoms of conduction bands of its even-numbered non-single-crystal semiconductor layers $M_{(m-1)}$, $M_{(m-4)}$, ... and $M_2$ since their energy gaps $Eg_{(m-1)}$, $Eg_{(m-3)}$, ... and $Eg_2$ are narrower than those of the non-single-crystal semiconductor layers $M_m$, $M_{m-2}$, ... and $M_1$. In this case, the electrons 21 flow though the non-single-crystal semiconductor layers $M_m$, $M_{m-2}$ ... and $M_3$ one after another along their conduction bands or in the case where these layers are sufficiently thin, the electrons 21 tunnel therethrough one after another.

On the other hand, the holes 22 injected into the non-single-crystal semiconductor region 4 are sequentially accumulated at the bottoms of the valence bands of the non-single-crystal semiconductor layers $M_2$, $M_4$, ... and $M_{(m-1)}$.

The electrons 21 and the holes 22 thus accumulated at the bottoms of the conduction band and the valence band of the non-single-crystal semiconductor layer $M_i$ undergo a compound radiative recombination as by band-to-band recombination, band-to-recombination center recombination and recombination between recombination centers in the non-single-crystal semiconductor layer $M_i$. As a result of this, light $L_i$ is produced in the non-single-crystal semiconductor layer $M_i$, and composite light L of light $L_2$, $L_4$, ... and $L_{(m-1)}$ is emitted to the outside.

Since the light $L_i$ from the non-single-crystal semiconductor layer $M_i$ is obtained by the abovesaid compound radiative recombination, it has spectrums distributed over a wide range of wavelength. Accordingly, the light $L_i$ can be obtained as light close to white light.

By making all or some of the energy gaps $Eg_2$, $Eg_4$, ... and $Eg_{(m-1)}$ of the non-single-crystal semiconductor layers $M_2$, $M_4$, ... and $M_{(m-1)}$ different, the light $L_2$, $L_4$, ... and $L_{(m-1)}$ can be made entirely or partly different. Therefore, the composite light L can be obtained as light close to white light.

Since the electrons 21 which are injected from the electrode 6 into the non-single-crystal semiconductor region 4 towards the electrode 1 are sequentially accumulated in the non-single-crystal semiconductor layers $M_{(m-1)}$, $M_{(m-3)}$, ... and $M_2$, the amount of electrons 21 which do not recombine with the holes 22 but reach the electrode 1 can be reduced far smaller than in the case of the conventional non-single-crystal semiconductor light emitting device described previously. Moreover, since the holes 22 which are injected from the electrode 1 into the non-single-crystal semiconductor region 4 towards the electrode 6 are also sequentially accumulated in the non-single-crystal semiconductor layers $M_2$, $M_4$, ... and $M_{(m-1)}$, the amount of holes 22 which do not recombine with the electrons 21 but reach the electrode 6 can be decreased far smaller than in the case of the aforementioned prior art device.

Thus, the non-single-crystal semiconductor light emitting device of the present invention shown in FIG. 1 achieves a light emitting efficiency far higher than does the aforementioned conventional non-single-crystal semiconductor light emitting device.

The foregoing description should be construed as merely illustrative of the present invention and should not be construed as limiting the invention specifically thereto. Also it is possible, for example, to employ such a structure as shown in FIG. 3 in which the non-single-crystal semiconductor layer 5 is omitted from the arrangement of FIG. 1 and the electrode 6 is formed on the non-single-crystal semiconductor region 4 in such a manner as to obtain rectifying contact therebetween.

Figure 4:
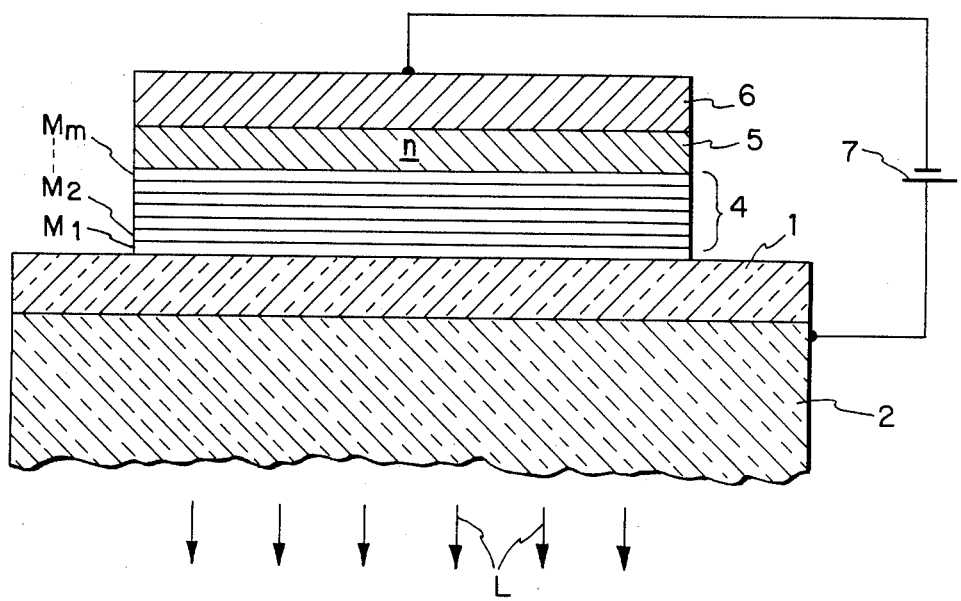

It is also possible to adopt such an arrangement as shown in FIG. 4 in which the non-single-crystal semiconductor layer 3 is omitted and the electrode 1 is formed on the non-single-crystal semiconductor region 4 in such a manner as to establish rectifying contact therebetween.

Figure 3:
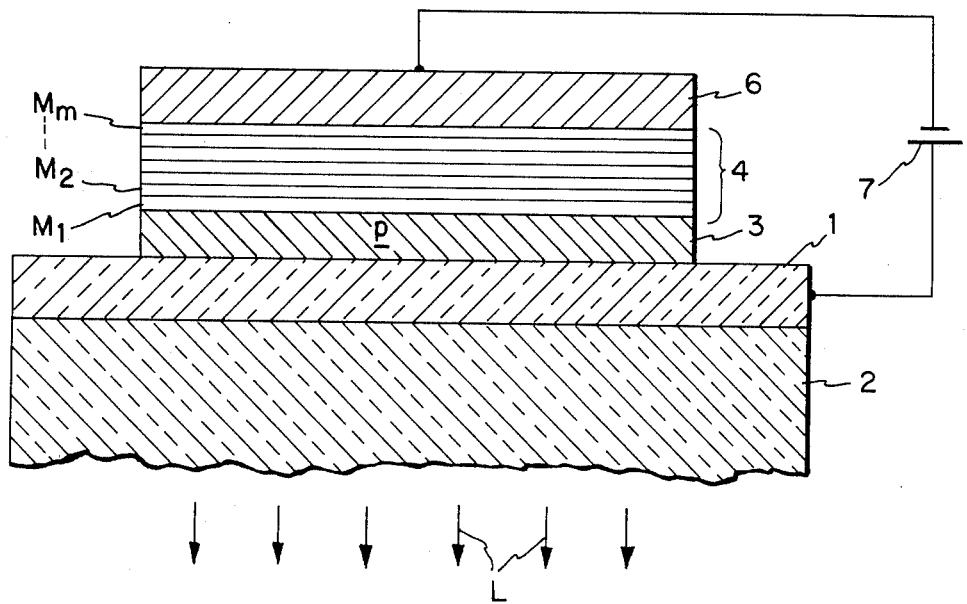
FIGS. 3, 4 and 5 are sectional views schematically illustrating second, third and fourth embodiments of the non-single-crystal semiconductor light emitting device of the present invention, respectively.
Figure 5:
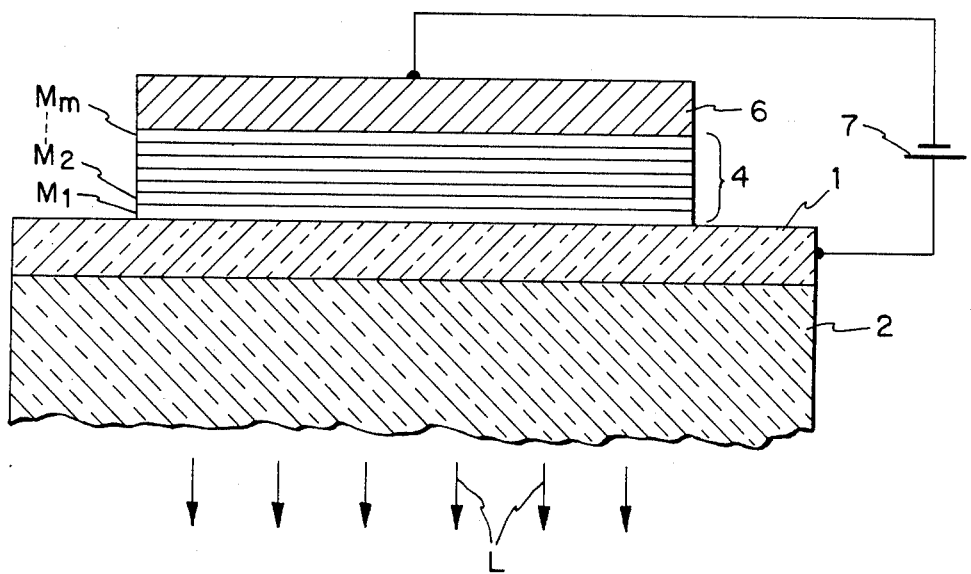

Further, it is also possible to combine the structures of FIGS. 3 and 4, as shown in FIG. 5 in which the non-single-crystal semiconductor layers 3 and 5 are omitted and the electrodes 1 and 6 are formed on both sides of the non-single-crystal semiconductor region 4 to establish rectifying contact therebetween.

Moreover, while the foregoing description has been given of the case where the non-single-crystal semiconductor region 4 is i-type, it may also be a p-type region sufficiently lower in impurity concentration than the p-type non-single-crystal semiconductor layer 3, or an n-type region sufficiently lower in impurity concentration than the n-type non-single-crystal semiconductor layer 5.

It will be apparent that many modifications and variations may be effected without departing from the scope of the novel concepts of the present invention.

What is claimed is:

1. A non-single-crystal semiconductor light emitting device comprising:
a non-single-crystal semiconductor region formed by a non-single-crystal semiconductor laminate member made of a plurality m (where m=>3) of non-single-crystal semiconductor layers $M_1$, $M_2$, ... and $M_m$ sequentially laminated in this order, wherein the energy gaps $Eg_1$, $Eg_2$ ... and $Eg_m$ of said non-single-crystal semiconductor layers bear such relationships as $Eg_1 > Eg_2 < Eg_3$, $Eg_3 > Eg_4 < Eg_5$, ... $Eg_{(m-2)} > Eg_{(m-1)} < Eg_m$, and wherein the energy gaps $Eg_2$, $Eg_4$, ... and $Eg_{(m-1)}$ are different from one another.

2. A non-single-crystal semiconductor light emitting device according to claim 1 wherein the non-single-crystal semiconductor layers $M_2$, $M_4$, ... and $M_{(m-1)}$ are formed of silicon carbides $Si_{x2}C_{1-x2}$, $Si_{x4}C_{1-x4}$, ... and $Si_{x(m-1)}C_{1-x(m-1)}$, and wherein x2, x4, ... x(m−1) are different from one another.

* * * * *